(12) United States Patent
Cho

(10) Patent No.: US 7,345,645 B2
(45) Date of Patent: Mar. 18, 2008

(54) METHOD OF MANUFACTURING SUBSTRATE FOR CIRCUIT BOARD AND SMART LABEL HAVING THE SUBSTRATE

(75) Inventor: Se-hoon Cho, Seongnam-si (KR)

(73) Assignee: Samsung Techwin Co., Ltd. (KR)

( * ) Notice: Subject to any disclaimer, the term of this patent is extended or adjusted under 35 U.S.C. 154(b) by 299 days.

(21) Appl. No.: 10/951,230

(22) Filed: Sep. 27, 2004

(65) Prior Publication Data

US 2005/0072595 A1    Apr. 7, 2005

(30) Foreign Application Priority Data

Oct. 1, 2003    (KR) .................... 10-2003-0068333

(51) Int. Cl.
*H01Q 1/12* (2006.01)
*G08B 13/14* (2006.01)

(52) U.S. Cl. ................................... 343/878; 340/572.1

(58) Field of Classification Search ................ 343/878, 343/895; 340/572.1
See application file for complete search history.

(56) References Cited

U.S. PATENT DOCUMENTS 6,693,541 B2 *  2/2004  Egbert ..................... 340/572.7
6,816,125 B2 * 11/2004  Kuhns et al. ............... 343/880

* cited by examiner

*Primary Examiner*—Shih-Chao Chen
(74) *Attorney, Agent, or Firm*—Tuchman & Park LLC

(57) ABSTRACT

A method of manufacturing a substrate for a circuit board includes forming a groove having a predetermined shape and pattern in at least one surface of a substrate formed of an insulating material, filling the groove with a conductive material, and forming a circuit pattern by hardening the conductive material filling the groove. The groove is preferably formed by impression with a die containing a pattern corresponding to the shape and pattern of the groove. A substrate and a smart label formed of the substrate are also disclosed.

19 Claims, 6 Drawing Sheets

METHOD OF MANUFACTURING SUBSTRATE FOR CIRCUIT BOARD AND SMART LABEL HAVING THE SUBSTRATE

BACKGROUND OF THE INVENTION

This application claims the priority of Korean Patent Application No. 2003-68333, filed on Oct. 1, 2003, in the Korean Intellectual Property Office, the disclosure of which is incorporated herein in its entirety by reference.

1. Field of the Invention

The present invention relates to a method of manufacturing an antenna for a device that transmits and receives information by a wireless transmitter and a wireless transmitter using the antenna.

2. Description of the Related Art

A smart label, typically known as a radio frequency identification (RFID) tag, generally refers to a communication or information device with an integrated circuit for storing various information and an antenna for communication with an external terminal. Such a smart label is generally used for inventory control or logistic management, as electronic identification cards, electronic moneys, or credits cards, or for other communication and information handling purposes. For example, when the smart card is used for logistic management purposes, the smart card can replace conventional markings such as bar codes and is attached to an object to be identified and managed. For managing inventory or logistic information, the conventional bar codes must be brought in close proximity to a bar code reader for identification of their information. However, when using the smart card, if the smart card is placed within a recognition range of a terminal such as an RF reader, the objects having the smart card can be recognized even if the smart card is placed in a hidden location or remotely placed from the terminal. Therefore, the smart label can be more efficiently used instead of the conventional bar code system.

Smart labels can often be classified into high frequency smart labels and low frequency smart labels according to the communication method with a terminal. Communications between the terminal and the smart label are typically implemented by a radio frequency (RF) signal. As such, exchange of information utilizing the smart label system can be faster than the conventional bar code system.

In a smart label using the RF signal, an antenna is formed on a substrate of the smart label. Conventional methods for forming an antenna on the substrate typically include: etching a laminated metal layer (e.g., Cu or Al) formed on a flexible substrate (e.g., PET, PE, or PVC) using a mask with a predetermined pattern; affixing wound wires for forming the antenna on the substrate using a liquid adhesive; and depositing a thin metal element on the substrate. However, the formation method of the antenna by etching requires an increased number of processes, such as exposing and developing of the laminated substrate typically by expensive equipments and using additional resources such as a developing solution. Thus, these formation methods utilizing the etching process are generally time consuming and costly. Also, these methods utilize wires and metal depositions, and thus, are uneconomical since they have low yields. These drawbacks need to be solved for the mass production of the smart labels, especially, in view of the fact that smart labels are often discarded after a single use.

FIG. 1 is a schematic drawing illustrating a conventional smart label, and FIG. 2 is a cross-sectional view taken along line II-II in FIG. 1.

Referring to FIGS. 1 and 2, a smart label 10 is shown, that can be used for transmitting or receiving a high frequency signal of 13.56 MHz, for instance. The smart label 10 has a chip 12 mounted on a support member 11 and an antenna 13 electrically connected to the chip 12 for wireless communications with a reader. The antenna 13 is formed on an outer surface of the support member 11, and has a loop circuit with an inner lead connected to a first terminal 14 formed on an inner side and a second terminal 15 formed on an edge of the support member 11. The first and second terminals 14 and 15 are electrically connected to each other. The first and second terminals 14 and 15 are typically connected to each other by a conductor 17 which crosses over the circuit lines of the rolled antenna 13. As shown, a liquid insulating material 16 is coated around the adjacent circuit lines of the antenna 13 and dried for preventing a short circuit of the antenna 13 by the circuit lines. The conductor 17 (such as an Ag paste) is formed on the insulating material. In particular, an Ag paste 17 is coated on the dried insulating material 16 and dried. The antenna 12 is configured in such a loop shape to allow wireless communications at a high frequency of 13.56 MHz with an external reader.

However, as described above, this conventional method of manufacturing a smart label is rather complicated and expensive.

SUMMARY OF THE INVENTION

The present invention provides a new method of forming a substrate for a smart label. The present invention also provides a smart label formed according to the substrate forming method.

According to one aspect of the present invention, a method of forming a substrate comprises: forming a groove having a predetermined shape and pattern in at least one surface of a substrate formed of an insulating material; filling a conductive material into the groove; and hardening the conductive material filled in the groove for providing a conductive circuit pattern.

The substrate may include an upper insulating layer and at least one lower insulating layer underlying the upper insulating layer. In this case, the groove having a predetermined shape and pattern is formed in the upper surface of the upper insulating layer.

The conductive circuit pattern formed of the conductive material has a configuration and dimension suitable for an antenna for wireless communication. The insulating material for the substrate can be one of PI, PET, and a paper board.

The forming of the patterned groove is preferably performed by pressing a die on the substrate while heating the insulating substrate to a suitable temperature for facilitating impression of the pattern. Here, the heating of the insulating substrate can be achieved by heating the die and pressing the insulating substrate with the heated die. The die may be a roller with a suitable circuit pattern thereon.

The shape of the groove formed in the surface of the substrate can be generally semicircular, sinusoidal, rectangular, inversed-trapezoidal, or inversed-triangle etc.

The groove can be filled with the conductive material using a squeezer. Alternatively, the groove may be filled with the conductive material using a dispenser or by other known methods. In this case, the conductive material can remain only within the groove during the hardening process, thereby forming an antenna with smooth edges.

The circuit pattern grooves may be formed in both surfaces of the substrate, and at least some portion of the resultant circuit patterns formed in both surface of the substrate are interconnected.

The forming of the circuit pattern groove may comprise forming perforations or cavities through the substrate at a location where the groove is formed, and depositing the conductive material on both surfaces of the substrate by filling or injecting the conductive material into the perforations and the groove formed in the upper surface of the substrate.

At least two portions of the circuit patterns formed in one surface of the substrate are electrically connected by the conductive material filled through the perforations. A through hole may be formed in at least one non-circuit pattern region of the substrate, and the conductive material may be filled or injected through the through hole.

The method may further include forming a predetermined hole in a non-circuit pattern region of the substrate to absorb a compressive stress exerting on the substrate when the circuit pattern is impressed with a die.

The method may further include forming of a metallic layer on the conductive circuit pattern of the substrate, the metallic layer containing at least one metal selected from the group consisting of copper, aluminum, tin, and nickel.

According to another aspect of the present invention, a substrate for a smart label comprises: a substrate formed of insulating material; and a conductive antenna disposed in a groove formed in a circuit pattern on an upper surface of the insulating substrate, the groove formed by impression with a die, and the conductive antenna including first and second terminal portions electrically connected to each other via a conductive connection member disposed at a lower surface of the insulating substrate.

The conductive antenna of the substrate is preferably formed with a conductive material filled in the groove. The conductive connection member of the substrate is preferably a conductive tape or film attached at the lower surface of the substrate, or it can be formed with a conductive paste applied at the lower surface of the substrate.

The insulating substrate may include an upper insulating layer and a lower insulating layer, and the antenna is formed on the upper insulating layer. The insulating substrate is formed preferably of a material selected from polyimide, polyethylene terephthalate, and a paper board. The insulating substrate may include a metallic layer disposed under the substrate and containing at least one metal selected from the group consisting of copper, aluminum, tin, and nickel.

According to another aspect of the present invention, a smart label comprises: a substrate formed of insulating material; a conductive antenna disposed in a groove of a circuit pattern formed on an upper surface of the insulating substrate, the groove formed by impression with a die, and the conductive antenna including first and second terminal portions electrically connected to each other via a conductive connection member disposed at a lower surface of the insulating substrate; and, an electronic chip attached to the insulating substrate and electrically connected to the antenna.

The conductive antenna of the smart label is preferably formed with a conductive material filled in the groove of the insulating substrate. The insulating substrate may include an upper insulating layer and a lower insulating layer, and the antenna is preferably formed on the upper insulating layer. The conductive connection member may be a conductive tape or thin film disposed on the lower surface of the substrate.

The conductive connection member may include a connecting groove pattern that constitutes a path connecting the first and second terminals extending on the lower surface of the substrate and where a conductive material is filled in the groove. The smart label may further include at least an injection inlet for filling the conductive material into the connecting pattern from an upper surface of the substrate, which is formed perforating through the upper surface of the substrate and connecting to the connecting groove pattern.

The smart label may further include a shield member for covering the connecting groove pattern formed on the lower surface of the substrate and filled with the conductive material. The smart label may further include a metallic layer disposed on the conductive material and containing at least one metal selected from the group consisting of copper, aluminum, tin, and nickel.

BRIEF DESCRIPTION OF DRAWINGS

The above-mentioned and other features and advantages of the present invention will become more apparent by describing in detail exemplary embodiments thereof with reference to the attached drawings in which.

DETAILED DESCRIPTION OF EMBODIMENTS

Figure 1:
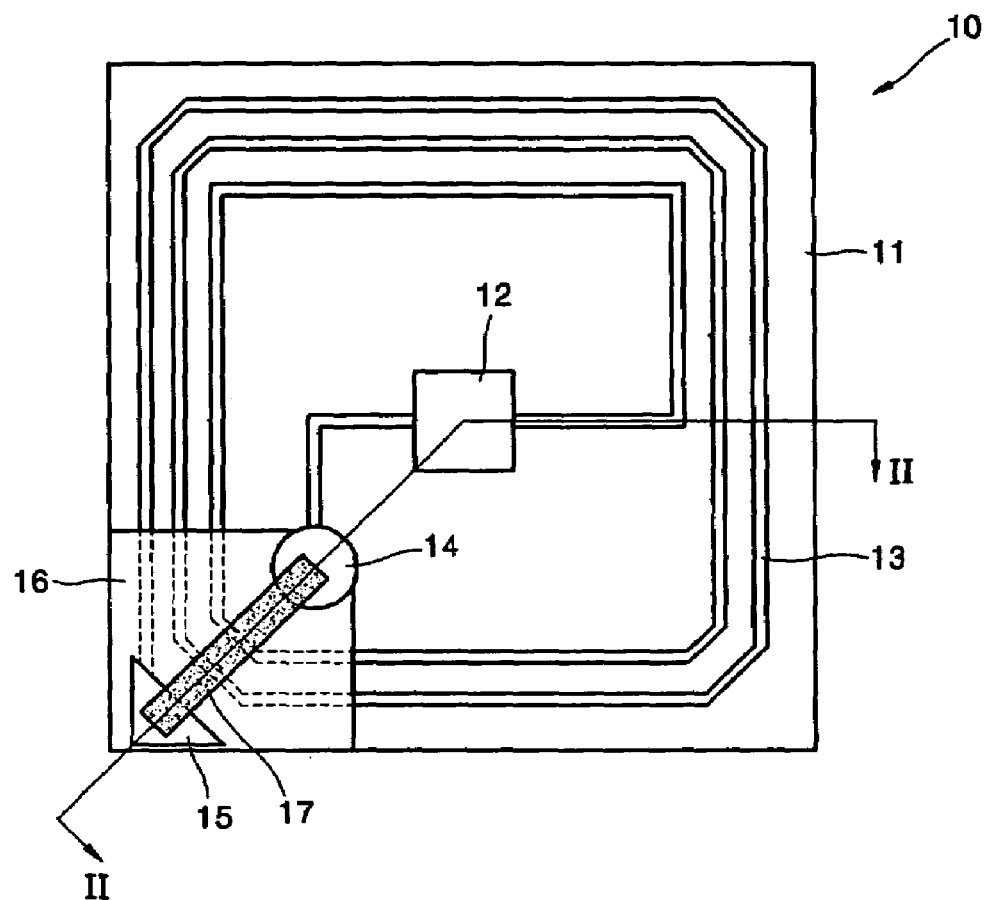
FIG. 1 is a schematic drawing illustrating a conventional smart label.
Figure 2:
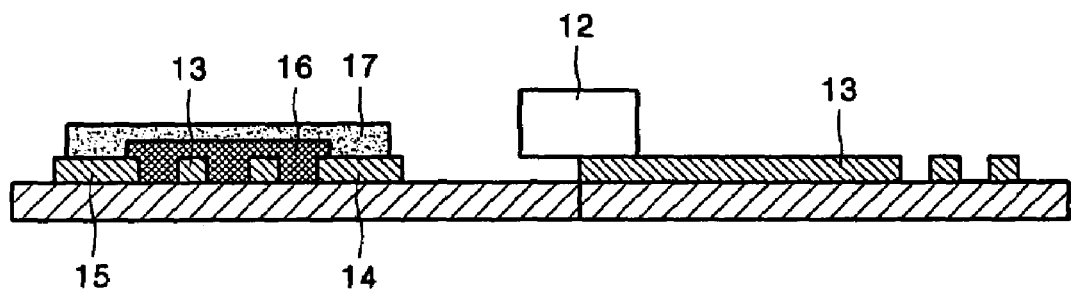
FIG. 2 is a cross-sectional view taken along line II-II in FIG. 1.

The present invention will now be described more fully with reference to the accompanying drawings in which preferred embodiments of the present invention are shown. Like reference numerals refer to the like elements throughout the drawings.

FIGS. 3A through 3D are cross-sectional views illustrating a method of manufacturing a substrate for a smart label according to an embodiment of the present invention.

Figure 3A:
FIGS. 3A through 3D are cross-sectional views illustrating a method of manufacturing a substrate according to an embodiment of the present invention.

Referring to FIG. 3A, a substrate 300 is an insulating material film formed typically of a material for a flexible PCB, such as polyimide (PI), polyethylene terephthalate (PET), or a paper board. The substrate may be provided in a cut form to a predetermined size, or alternatively, in a rolled film.

Figure 3B:
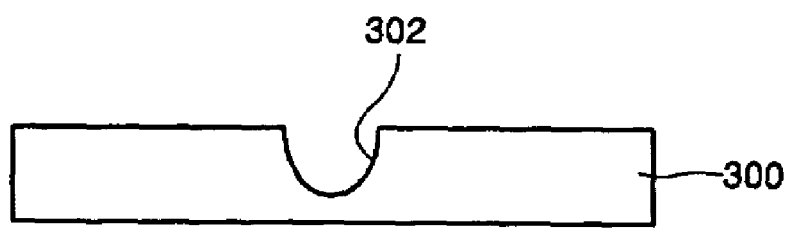

Referring to FIG. 3B, a circuit pattern 302 is formed in the substrate 300. As shown, the circuit pattern 302 has a generally semicircular or sinusoidal cross section, but can have other shapes such as a generally rectangular or inversed-trapezoidal shape, or a generally inversed-triangular shape. The circuit pattern 302 can be formed, for example, by using a die (not shown) with an impressing or embossing pattern corresponding to the circuit pattern 302. The die can be in form of a roller or a substantially flat die having the impressing pattern thereon. The circuit pattern 302 can be formed by pressing the die or roller against the substrate while applying heat to a suitable temperature onto the substrate 300.

In order to heat the substrate to the desired temperature, the die and supporting members of the die equipment which support the substrate 300 can be heated to a certain degree before pressing the substrate 300 by the die. When heat is applied to the substrate 300, the substrate 300 becomes more flexible. By pressing the flexible substrate 300 using the die on which a predetermined circuit pattern is formed, the flexible substrate 300 is plastically deformed and forms resultant grooves thereon in the circuit pattern 302. Alternatively, such grooves can also be formed in the substrate 300 by just pressing it with a die without prior heating of the substrate depending on the particular material of the substrate. Otherwise, an additional material such as a solder resist can be deposited on the surface of the substrate before pressing with the die.

Such a die having the pattern corresponding to the circuit pattern 302 can be a conventional leaf-type press die or a roller-type die. The flexible substrate materials, such as PET or PI, can be provided in a roll. A suitable embossing or impressing pattern matching the circuit pattern 302 of the substrate 300 is formed on the roller-type die. An opposing member facing to the roller-type die can be a die or a pressing roller. Accordingly, the circuit pattern 302 can be consecutively formed on the flexible substrate 300 while pressing the flexible substrate 300 which is continuously supplied between the roller die and the pressing roller from the substrate roll. More than one embossing pattern can be formed on the roller-type die from a manufacturing concern. This may in some case optimize the manufacturing process of the substrate. Alternatively, the circuit pattern 302 may be formed in other methods known in the art, such as scribing with a cutter or laser imprinting.

After performing a series of operations on the substrate, such as forming an impressed circuit pattern by a roller-type die as described and filling the pattern with a conductive material (to be described herein-after), the substrate can be cut into individual substrates by a substrate cutting process.

The pressing stress applied to the surface of the substrate 300 during the process of forming the circuit pattern 302 of FIG. 3B can be absorbed if suitably configured holes are formed, before performing the circuit pattern forming process, at various locations in the insulating substrate 300 on which the circuit pattern 302 is not to be formed.

In addition, by heating the insulating substrate 300 to a predetermined temperature, the substrate 300 can be effectively pressed with the die while simultaneously heating the die. In some cases, the insulating substrate 300 can be heated to a suitable deformation temperature either by the heated die or by the heated die or pressing roller which faces the die.

Figure 3C:
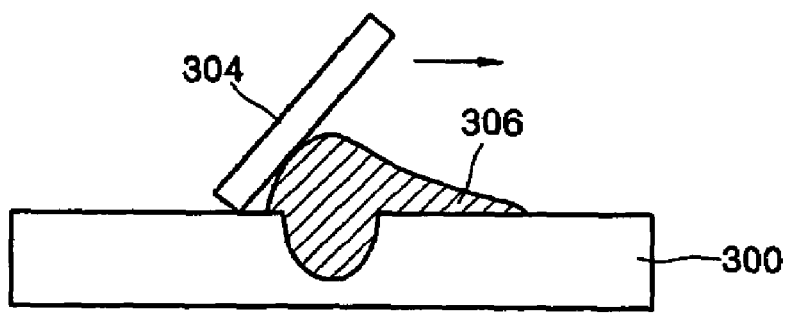
Figure 3D:
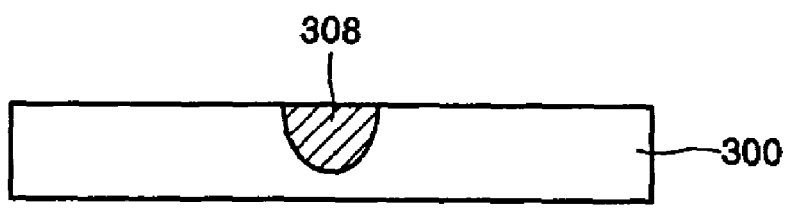

Referring to FIG. 3C, the patterned groove 302 formed preferably by the plastic deformation described above is filled with a conductive material 306. Examples of the conductive material include a conductive paste, conductive ink, and other suitable conductive materials. The groove 302 can be filled with the conductive material 306 using a squeezer 304 or other suitable means. Referring to FIG. 3D, a circuit pattern 308 is formed in the grooves 302 preferably to an even level with the upper surface of the substrate 300.

However, before performing the process of FIG. 3C, a thin oily material can be coated around the upper surface of the substrate 300 on which the groove 302 is formed. The purpose of applying the oily material is to avoid staining of or otherwise facilitate cleaning of the upper substrate surface where the conductive material is not intended to be attached during the conductive filling of the engraved groove 302 by the squeezer 304.

A smart label can be manufactured in a low cost by providing an antenna on the substrate formed by the method above described.

Figure 4A:
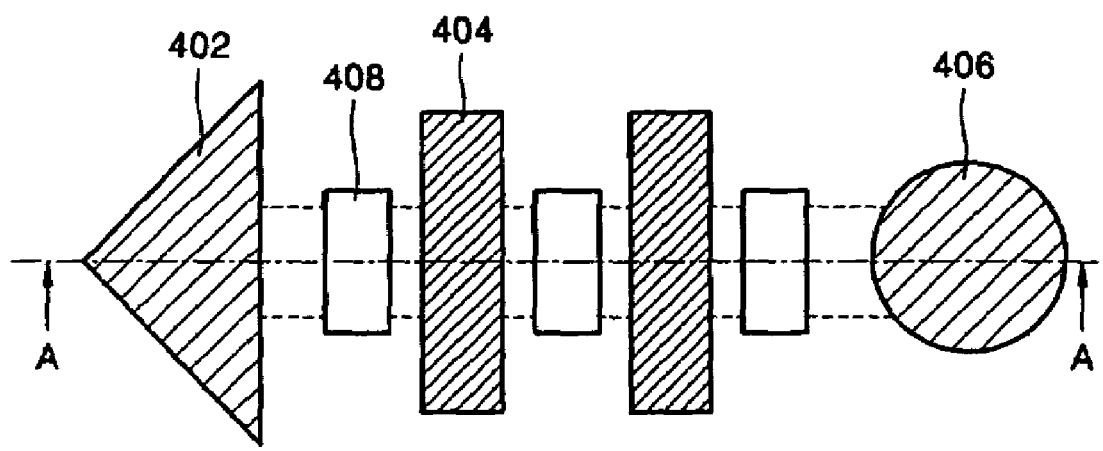
FIGS. 4A and 4B illustrate an antenna pattern for a smart label according to one embodiment of the present invention.
Figure 4B:
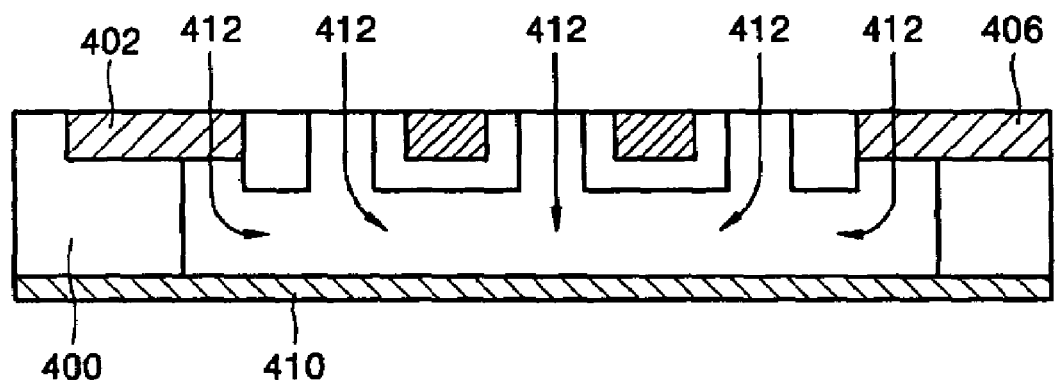

FIGS. 4A and 4B schematically illustrate an antenna pattern disposed on a smart label according to one embodiment of the present invention. The antenna pattern on the substrate can be formed by the method of manufacturing a substrate described above in connection with FIGS. 3A through 3D.

Figure 5:
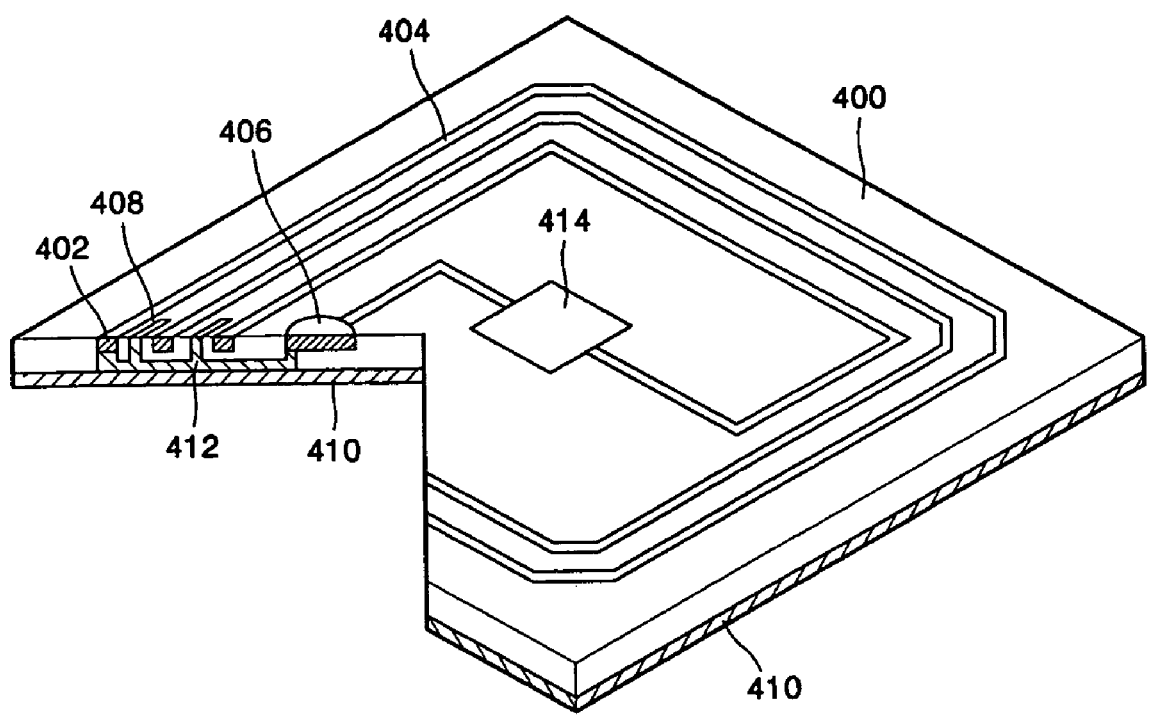
FIG. 5 is a partially cut-away, perspective view illustrating a smart label manufactured by the method depicted in FIGS. 4A and 4B.

Referring to FIGS. 4A, 4B, and 5, a smart label of one preferred embodiment of the invention is illustrated, which includes an antenna 404 formed in a loop (FIG. 5) and a electronic chip 414 connected to the antenna 404 with first and second terminals 402 and 406, collectively forming a closed circuit. In order to form the closed circuit, a connecting member 412 (shown in FIG. 5, and also depicted by dotted lines in FIG. 4A) is formed on a lower surface of insulating substrate 400 in addition to the antenna 404 formed on an upper surface of the substrate as described above. The connecting member 412 connects with the first and second terminals 402 and 406 of the antenna 404, and thus completes the closed circuit. The pattern (i.e., grooves) of the lower connecting member 412 can be formed by impressing the flexible substrate 400 with a die having a corresponding pattern as similar to the forming of the antenna pattern described above in connection with FIG. 3B. The first and second terminals 402 and 406 of the antenna are electrically connected to each other by filling a conductive material into the lower connecting pattern through paste provision or injection inlets 408. In order to fill the conductive material in the lower connecting groove pattern, a sealed or controlled cavity is formed in the substrate 400. The sealed or controlled cavity of the substrate 400 can be formed by attaching an attaching or shielding member 410 on a lower surface of the substrate 400.

FIG. 4B is a cross-sectional view taken along line A-A of FIG. 4A and further illustrates the filling process of the conductive material through the paste provision inlets 408, the first terminal pattern 402, and the second terminal pattern 406 from the upper surface of the substrate 400. The pattern is filled with the conductive material while the substrate is sealed by the attaching member 410 on the lower surface of the substrate 400. Here, the attaching member 410 is preferably a tape attached on the smart label and to be adhered to an object product. The paste provision inlets 408 are selectively included for easy injection or supply of the conductive paste into the lower connecting pattern cavity. The paste provision inlets 408 can be two or more, and at least one of them can function as a discharge outlet or breathing hole depending on the particular design of the manufacture.

FIG. 5 is a perspective view of the smart label manufactured by the method described above with reference to FIGS. 4A and 4B, with a portion cut away for illustration purposes. The antenna pattern except for the connection member 412 of the first and second terminals 402 and 406 can be formed by the method described above with reference to FIGS. 3A-3D.

Figure 6A:
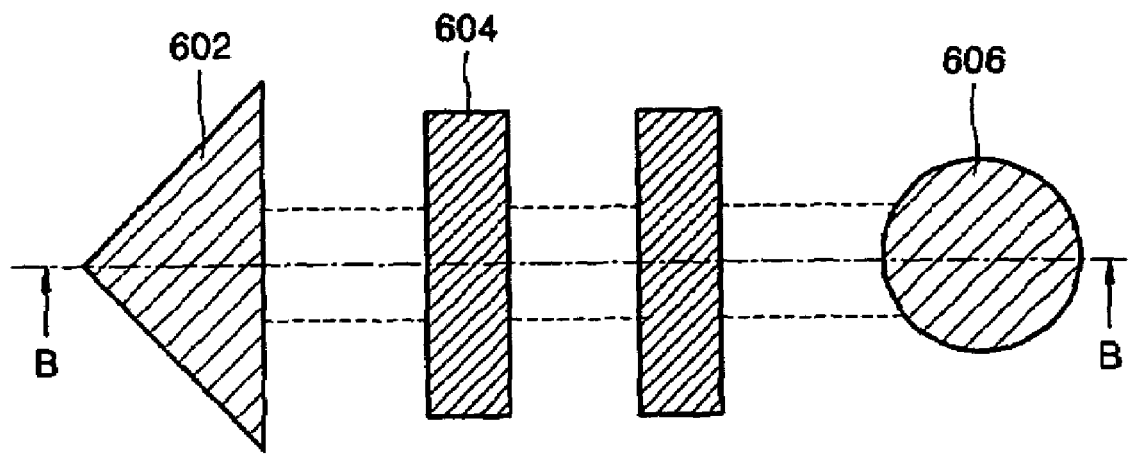
FIGS. 6A and 6B illustrate a method of manufacturing a substrate for forming an antenna pattern for a smart label according to an embodiment of the present invention.
Figure 6B:
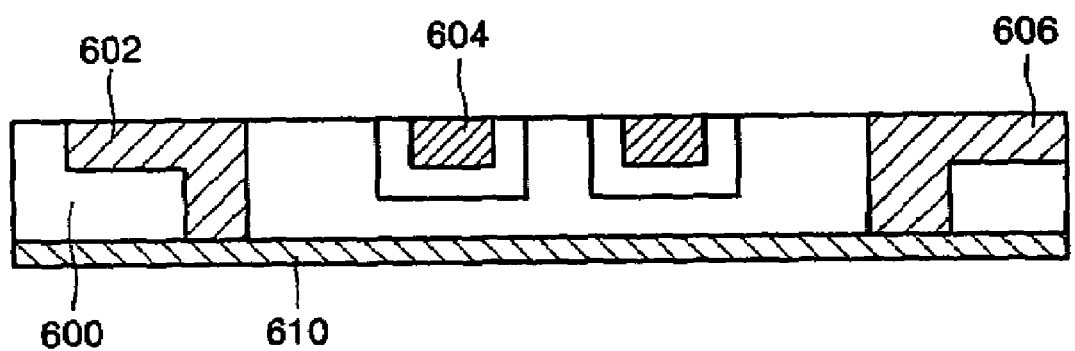

FIGS. 6A and 6B schematically illustrate an antenna pattern for a smart label according to another embodiment of the present invention. The antenna pattern 604 formed on the substrate can be formed by the formation methods of the substrate described with reference to the FIGS. 3A-3D.

Figure 7:
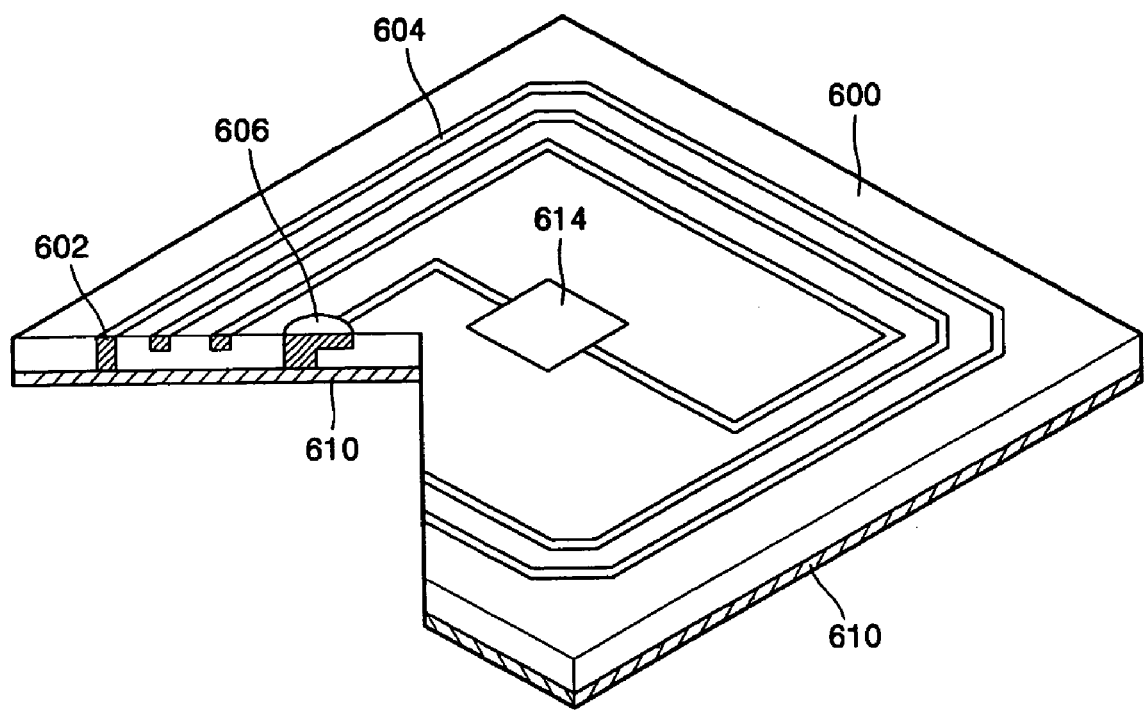
FIG. 7 is a partially cut-away, perspective view illustrating a smart label manufactured by the method depicted in FIGS. 6A and 6B.

Referring to FIGS. 6A, 6B, and 7, first and second terminals 602 and 606 of the antenna are formed by perforating holes through the upper and lower surfaces of the substrate 600, and then filling a conductive material in the cavity of the holes. The first and second terminals 602 and 606 of the antenna can be electrically connected by a connecting pattern formed on a lower surface of the substrate as depicted with dotted lines in FIG. 6A.

FIG. 6B is a cross-sectional view taken along line B-B in FIG. 6A. The first and second terminals 602 and 606 of the antenna are electrically connected by a conductive connection member 610. Here, the conductive connection member 610 can be a conductive tape or a thin film formed of a conductive material and attached on the lower surface of the substrate 600.

FIG. 7 is a partially exploded perspective view illustrating the smart label manufactured by the method described above with reference to FIGS. 6A and 6B, and shows a closed circuit formed by the loop type antenna 604, electronic chip 614, first terminal 602, conductive connection member 610, and second terminal 606. According to one embodiment of the invention as shown in the drawing, the conductive connection member 610 is attached to an entire surface of the lower surface of the substrate 600. However, the conductive connection member 610 can be attached only to a portion of the substrate 600 including the area of the first and second terminals 602 and 606, and an insulating tape can be attached thereon to the remaining surface or on the entire surface of the substrate over the conductive member 610.

As shown in FIG. 7, the first and second terminals 602 and 606 of the antenna are formed by perforating the substrate 600 and filling a conductive material inside of the perforations. The terminals 602 and 606 are electrically connected by the conductive connection member 610. Here, the conductive connection member 610 can be formed by attaching a conductive tape on a lower surface of the substrate 600 or by applying a conductive paste on a lower surface of the substrate 600. Additionally, after the conductive material has been hardened, a metal plated layer may further be formed on the hardened conductive material using, for example, Cu, Al, Sn, Ni, or similar metal to improve the electrical characteristics of the conductive material and to provide a longer communication range to the smart label.

Although the embodiments described above with reference to the appended drawings illustrate the substrate for a smart label with a single layered structure, the substrate according to the present invention is not limited thereto. Thus, the substrate may have a multiple-layer or stacked structure including an upper insulating layer and at least one lower insulating layer underlying below the upper insulating layer. For example, the substrate of a smart label of the invention can include a relatively hard lower layer (such as glass which is difficult to form an impressed pattern thereon) and a relatively soft upper insulating layer (such as solder resist), and an impressed circuit pattern is formed on the soft upper layer by impressing with a die and the pattern is filled with a conductive material in a similar method described above.

For another example of the stacked structure, the substrate of a smart label of the invention can include a metallic base, a lower insulating layer disposed on the base, and an upper insulating layer disposed on the lower insulating layer. A circuit pattern is formed on an exposed surface of the upper insulating layer and is filled with a conductive material in a similar manner as described above to form the smart label on the metallic base. In this smart label, an electrical short between the metallic base and the conductive material of the circuit pattern can be prevented by the intervening lower insulating layer.

In the present invention disclosure as described above, a smart label refers not only to the wireless communication device to be attached to the object to be identified and managed but also to that formed on the object itself, for example, a display panel, an engine, and an information handling device, etc.

The present invention as described herein above may have the above discussed and following advantages.

In comparison to the conventional smart labels involving a complicated manufacturing process, which include exposing, developing, and etching to form an antenna pattern, and coating and hardening of an insulating paste and coating and hardening of a conductive material to connect a positive terminal to the antennal pattern, such a manufacturing process is simplified according to the present invention. For example, a circuit pattern is formed into the substrate by a simple formation process described above, preferably by impressing the circuit pattern using a die.

The manufacturing cost can be reduced since expensive materials such as specially-adapted ink for etching are not required. According to the invention, the substrate can be manufactured using a paste with a good conductivity but not a special conductive material containing a large amount of additives for printing.

According to the invention, smart labels can be effectively produced on a mass scale because a die is used to manufacture the circuit substrate.

Because the conventional smart labels use special conductive materials containing a large amount of printing additives with a low conductivity, the antenna needs to be formed with wider lines to overcome the conductivity problem. However, according to the present invention, there is no need to increase the width of the antenna since such special conductive materials containing a large amount of dielectric printing additives are not used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a substrate for a smart label, comprising:
   providing a generally thin substrate formed of an insulating material;
   forming a groove in a circuit pattern on an upper surface of the substrate;
   subsequently filling a conductive material in the groove previously formed by said forming of the groove; and
   hardening the conductive material filled in the groove.

2. The method of claim 1, wherein the substrate includes an upper insulating layer and at least one lower insulating layer underlying below the upper insulating layer, and said forming of the groove is performed on the upper surface of the upper insulating layer.

3. The method of claim 1, wherein said forming of the groove is performed by pressing the substrate with a die while heating the insulating substrate.

4. The method of claim 3, wherein said heating of the insulating substrate includes heating of the die and said pressing of the substrate is performed with the heated die.

5. The method of claim 3, wherein the die is a roller with a circuit pattern corresponding to the circuit pattern of the substrate.

6. The method of claim 1, wherein the circuit pattern of the substrate is suitably shaped for an antenna for a smart label.

7. The method of claim 1, wherein said filling of the groove with the conductive material is performed with a squeezer.

8. The method of claim 1, further comprising forming of a second groove in a circuit pattern on a lower surface of the substrate in a manner that the two grooves on both surfaces of the substrate are interconnected.

9. The method of claim 8, further comprising attaching of a shield member on the lower surface of the substrate and thereby providing a cavity adjacent the lower surface of the substrate.

10. The method of claim 9, further comprising filling of the cavity with a conductive material and thereby electrically connecting the circuit patterns of the upper and lower surfaces of the substrate.

11. The method of claim 10, wherein each of the circuit patterns of the substrate has first and second terminal portions and said electrical connection is made via the terminal portions.

12. The method of claim 10, wherein the second groove formed on the lower surface of the substrate includes at least one inlet on the upper surface of the substrate for filling the conductive material in the cavity adjacent the lower surface of the substrate through the at least one inlet and thereby electrically connecting the circuit patterns of the upper and lower surfaces of the substrate.

13. The method of claim 12, wherein the second groove formed on the lower surface of the substrate includes two or more inlets on the upper surface of the substrate for filling the conductive material in the cavity adjacent the lower surface of the substrate through the inlets, and wherein at least one of the inlets functions as a breathing hole for facilitating said filing of the conductive material.

14. The method of claim 1, wherein the circuit pattern of the upper surface of the substrate includes first and second terminal portions, the terminal portions extending to a lower surface of the substrate, and the terminal portions are filled with the conductive material.

15. The method of claim 14, further comprising attaching of a conductive member on the lower surface of the substrate and thereby electrically connecting the two terminal portions.

16. A method of forming a substrate for an information device capable of transmitting and receiving information by a wireless transmitter, the method comprising:
   providing a generally thin substrate formed of an insulating material;
   forming a groove in a circuit pattern on an upper surface of the substrate;
   subsequently filling a conductive material in the groove previously formed by said forming of the groove, the conductive material filled in the groove usable for an antenna for the information device; and
   hardening the conductive material filled in the groove.

17. The method of claim 16, further comprising:
   forming a second groove on a lower surface of the substrate in a manner for connecting with the conductive material filled in the groove on the upper surface of the substrate, the second groove including at least one inlet on the upper surface of the substrate;
   attaching a shield member on the lower surface of the substrate and thereby providing a cavity adjacent the lower surface of the substrate; and
   filling a conductive material in the cavity through the at least one inlet, and thereby forming a closed electrical circuit with the conductive material filled in the first and second grooves.

18. The method of claim 17, wherein the second groove includes two or more inlets on the upper surface of the substrate for filling the conductive material in the cavity through the inlets, and wherein at least one of the inlets functions as a breathing hole for facilitating said filing of the conductive material.

19. The method of claim 16, wherein the circuit pattern of the upper surface of the substrate includes first and second terminal portions, the terminal portions extending to a lower surface of the substrate, and the terminal portions are filled with the conductive material.

* * * * *